United States Patent [19]
Findikoglu et al.

[11] Patent Number: 5,543,386
[45] Date of Patent: Aug. 6, 1996

[54] JOINT DEVICE INCLUDING SUPERCONDUCTIVE PROBE-HEADS FOR CAPACITIVE MICROWAVE COUPLING

[75] Inventors: Alp T. Findikoglu, College Park, Md.; Takao Nakamura, Osaka, Japan

[73] Assignees: Sumitomo Electric Industries, Ltd., Osaka, Japan; University of Maryland, College Park, Md.

[21] Appl. No.: 202,569

[22] Filed: Feb. 28, 1994

[51] Int. Cl.⁶ .............................. H01B 12/06; H01P 5/00
[52] U.S. Cl. .................. 505/210; 505/220; 505/700; 505/701; 505/866; 333/99 S; 333/24 C; 333/246; 257/662
[58] Field of Search .................. 333/99 S, 24 C, 333/246; 505/210, 204, 220, 700, 701, 706, 866; 257/661–663

[56] References Cited

U.S. PATENT DOCUMENTS

| | | | |
|---|---|---|---|
| 4,697,143 | 9/1987 | Lockwood et al. | 333/246 X |
| 4,837,536 | 6/1989 | Honjo | 333/247 |
| 4,970,395 | 11/1990 | Kruse, Jr. | 250/336.2 |
| 5,219,827 | 6/1993 | Higaki et al. | 333/99 SX |
| 5,256,636 | 10/1993 | Wellstood et al. | 505/190 |
| 5,291,035 | 3/1994 | Wellstood et al. | 257/33 |
| 5,329,261 | 7/1994 | Das | 333/17.2 |

FOREIGN PATENT DOCUMENTS

| | | |
|---|---|---|
| 0483784 | 5/1992 | European Pat. Off. . |
| 0508893 | 10/1992 | European Pat. Off. . |
| 472777 | 3/1992 | Japan . |

OTHER PUBLICATIONS

Lancaster, M. J. et al, "Superconducting microwave resonators"; *IEE Proceedings* –H, vol. 139, No. 2; Apr. 1992; pp. 149–155.

Galt et al., "Characterization of a tunable thin film microwave $YBa_2Cu_3O_{7-x}/SrTiO_3$ coplanar capacitor," Appl. Phys. Lett. 63 (22), 29 Nov. 1993, pp. 3078–3080.

Babbitt et al., "Planar Microwave Electro–optic Phase Shifters," Microwave Journal, Jun. 1992, pp. 63–79.

Varadan et al., "Ceramic Phase Shifters for Electronically Steerable Antenna Systems," Microwave Journal, Jan. 1992, pp. 116–127.

Findkikoglu et al., "A noncontact cryogenic measurement system for superconducting device characterization," Rev. Sci. Instrum. 65 (9), Sep. 1994, pp. 2912–2915.

Laskar et al., "An On–Wafer Cryogenic Microwave Probing System for Advanced Transistor and Superconductor Applications," Microwave Journal, Feb. 1993, pp. 108–114.

Findikoglu et al., "Effect of dc electric field on the effective microwave surface impedance of $YBa_2Cu_3O_7/SrTiO_3YBa_2Cu_3O_7$ trilayers," Appl. Phys. Lett. 63 (23), 6 Dec. 1993, pp. 3215–3217.

Ramesh et al., "Ferroelectric $pbZr_{0.2}Ti_{0.8}O_3$ thin films on epitaxial Y–Ba–Cu–O," Appl. Phys. Lett., vol. 59, No. 27, Dec. 1991; pp. 3542–3544.

Hermann et al., "Oxide Superconductors and Ferroelectrics–Materials for a New Generation of Tunable Microwave Devices," Journal of Superconductivity, vol. 7, No. 2, 1994, pp. 463–469.

*Primary Examiner*—Benny T. Lee
*Attorney, Agent, or Firm*—Foley & Lardner

[57] ABSTRACT

A joint device structure for capacitive microwave coupling of a superconducting device arranged on a substrate with room temperature circuitry; including a superconducting wave guide of an oxide superconductor on said substrate from one side to the superconducting device launching microwave to the superconducting device, a pair of superconducting groundplanes of an oxide superconductor arranged at an end of the superconducting wave guide sandwiching the end of the superconducting wave guide with a little gap and a microwave probe-head connected to the room temperature circuitry arranged above the superconducting wave guide with a coupling gap having three probing pins corresponding to the superconducting wave guide and the superconducting groundplanes.

14 Claims, 2 Drawing Sheets

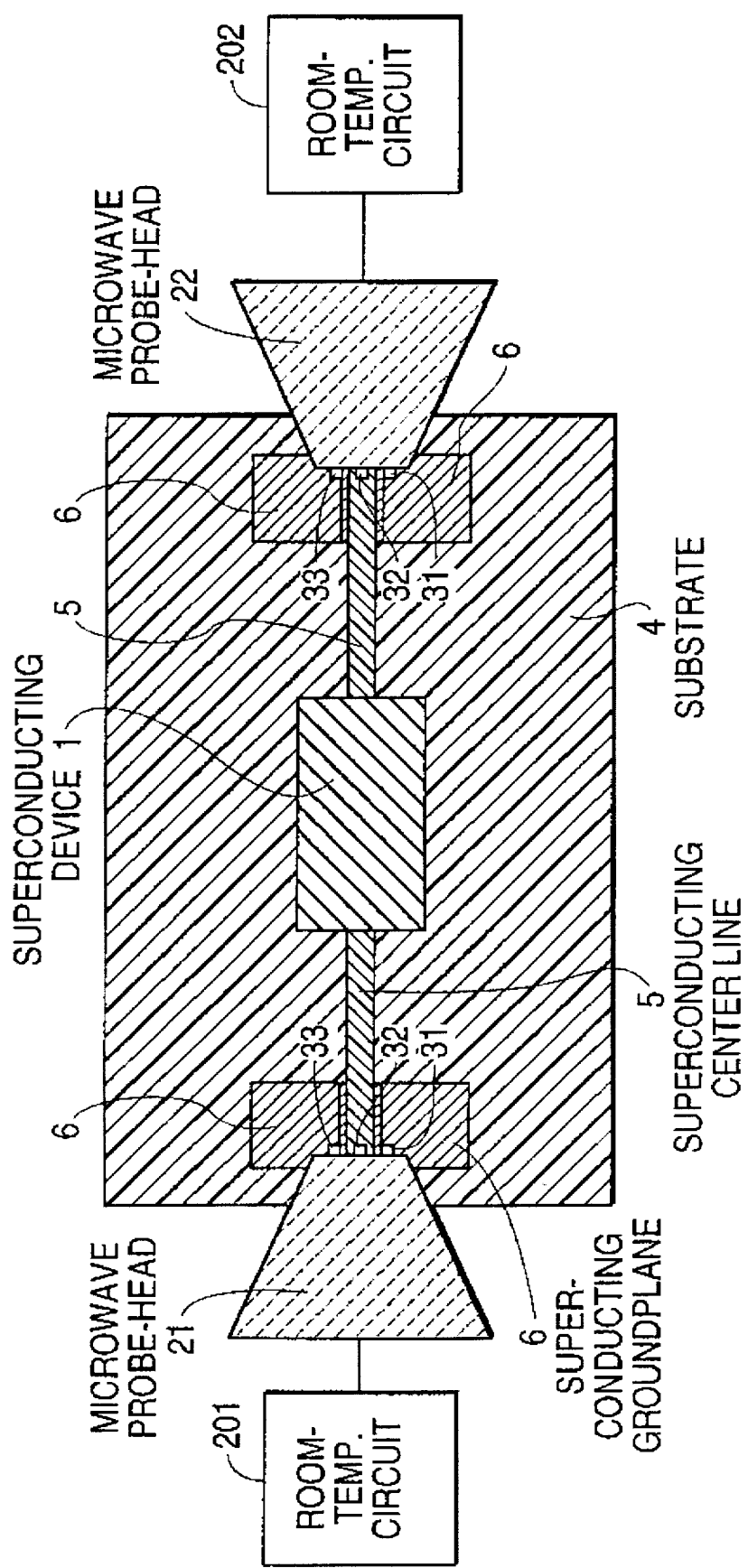

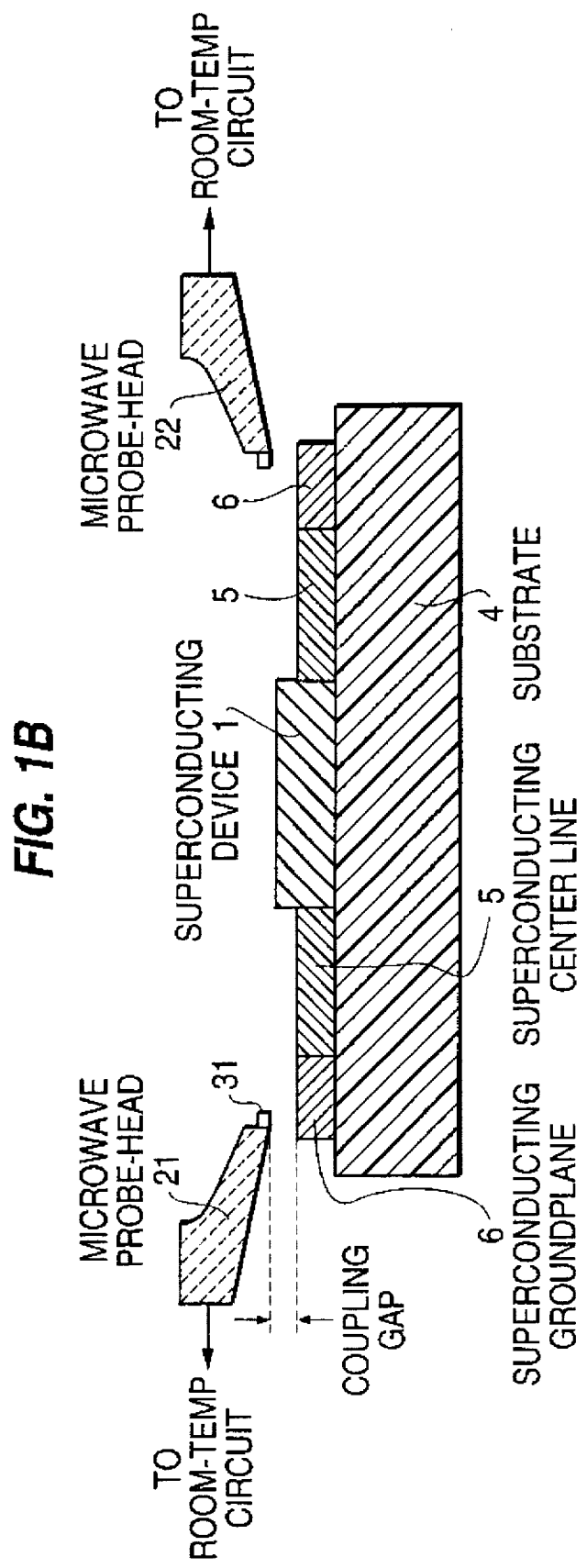

JOINT DEVICE INCLUDING SUPERCONDUCTIVE PROBE-HEADS FOR CAPACITIVE MICROWAVE COUPLING

BACKGROUND OF THE INVENTION

1. Field of the Invention

The present invention relates to a joint device for capacitive microwave coupling, and particularly to a joint device for capacitive microwave coupling which is suitable for coupling of a superconducting device with room temperature circuitry.

2. Description of Related Art

Electromagnetic waves called "microwaves" or "millimetric waves" having a wavelength ranging from tens of centimeters to millimeters can be theoretically said to be merely a part of an electromagnetic wave spectrum, but in many cases, have been considered from an engineering view point as being a special independent field of the electromagnetic waves, since special and unique methods and devices have been developed for handling these electromagnetic waves.

In the case of propagating an electromagnetic wave in frequency bands which are called the microwave and the millimetric wave, a twinlead type feeder used in a relative low frequency band has an extremely large transmission loss. In addition, if an inter-conductor distance approaches a wavelength, a slight bend of the transmission line and a slight mismatch in a connection portion causes reflection and radiation, and propagation of the electromagnetic wave is easily influenced from adjacent objects because of electromagnetic interference. Thus, a tubular waveguide having a sectional size comparable to the wavelength has been traditionally used. The waveguide and a circuit connected to the waveguide constitute a three-dimensional circuit, which is larger than components used in ordinary electric and electronic circuits. Therefore, application of the microwave circuit has been limited to special fields.

However, miniaturized devices composed of semiconductor have been developed as an active element operating in a microwave band. In addition, with advancement of integrated circuit technology, a so-called microstrip line having a extremely small inter-conductor distance has traditionally been used instead of tubular wave guides.

In general, the microstrip line has an attenuation coefficient that is attributable to a resistance component of the conductor. This attenuation coefficient attributable to the resistance component increases in proportion to a root of a frequency. On the other hand, the dielectric loss increases in proportion to increase of the frequency. However, the loss in a recent microstrip line is almost attributable to the resistance of the conductor in a frequency region not greater than 10 GHz, since the dielectric materials have been improved. Therefore, if the resistance of the conductor in the strip line can be reduced, it is possible to greatly elevate the performance of the microstrip line. Namely, by using a superconducting microstrip line, the loss can be significantly decreased and microwaves of a higher frequency range can be transmitted.

As is well known, the microstrip line can be used as a simple signal transmission line. In addition, if a suitable patterning is applied, the microstrip line can be used as microwave components including an inductor, a filter, a resonator, a delay line, etc. Accordingly, improvement of the microstrip line will lead to improvement of characteristics of the microwave component.

In addition, the oxide superconductor material (high $T_c$ copper oxide superconductor) which has been recently discovered makes it possible to realize the superconducting state by low cost liquid nitrogen cooling. Therefore, various microwave components using an oxide superconductor have been proposed.

However, it is almost impossible to assemble microwave equipment with microwave components using solely oxide superconductor based devices. Therefore, most microwave equipment using superconducting microwave components have both a low temperature part of its circuitry comprising the superconducting microwave components and a high temperature part comprising the conventional room temperature circuitry.

The resulting obstacles include a costly and complicated cooling system of the low temperature part and the difficulty of coupling of the low temperature part of circuitry with the conventional room temperature circuitry.

SUMMARY OF THE INVENTION

Accordingly, it is an object of the present invention to provide a joint device for capacitive microwave coupling which has overcome the above mentioned defect of the conventional ones.

The above and other objects of the present invention are achieved in accordance with the present invention by a joint device structure for capacitive microwave coupling of a superconducting device arranged on a substrate with room temperature circuitry including a superconducting wave guide of an oxide superconductor on the substrate from one side to the superconducting device launching microwave to the superconducting device, a pair of superconducting groundplanes of an oxide superconductor arranged at an end of the superconducting wave guide sandwiching the end of the superconducting wave guide with a little gap and a microwave probe-head connected to the room temperature circuitry arranged above the superconducting wave guide with a coupling gap having three probing pins corresponding to the superconducting wave guide and the superconducting groundplanes.

The superconducting signal conductor layer and the superconducting groundplane of the joint device structure in accordance with the present invention can be formed of thin films of general oxide superconductor materials such as a high critical temperature (high-Tc) copper-oxide type oxide superconductor material typified by a Y—Ba—Cu—O type compound oxide superconductor material, a Bi—Sr—Ca—Cu—O type compound oxide superconductor material, and a Tl—Ba—Ca—Cu—O type compound oxide superconductor material, a Hg—Ba—Sr—Ca—Cu—O type compound oxide superconductor material, a Nd—Ce—Cu—O type compound oxide superconductor material. In addition, deposition of the oxide superconductor thin film can be exemplified by a sputtering process, a laser ablation process, a co-evaporation process, etc.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

BRIEF DESCRIPTION OF THE DRAWINGS

FIG. 1A is a plane view showing an embodiment of the joint device for capacitive microwave coupling in accordance with the present invention; and FIG. 1B is a diagrammatic sectional view of the joint device, shown in FIG. 1A.

DESCRIPTION OF THE PREFERRED EMBODIMENTS

Referring to FIGS. 1A and 1B, there is shown a diagrammatic plane view and sectional view showing an embodiment of a joint device for capacitive microwave coupling in accordance with the present invention.

The shown joint device comprises the probe-heads 21 and 22 connected to room temperature circuitry 201 and 202, superconducting center lines 5 of $Y_1Ba_2Cu_3O_{7-\delta}$ oxide superconductor (where $0 \leq \delta \leq 0.5$) and superconducting groundplanes 6 of a $Y_1Ba_2Cu_3O_{7-\delta}$ oxide superconductor arranged on the substrate 4 and couples the superconducting device 1, for example a series LC resonator with a tunable capacitor, with the room temperature circuitry 201 and 202 connected to the microwave probe-heads 21 and 22. The superconducting center lines 5 are wave guides which lie across the substrate 4 and launch microwaves to and from the superconducting device 1. One pair of the superconducting groundplanes 6 are respectively arranged at the both ends of the superconducting center lines 5, which sandwich the ends with a little gaps.

The microwave probe-heads 21 and 22 have three probing pins 31, 32 and 33 which stand in a single column as shown in FIG. 1. The microwave probe-heads 21 and 22 are disposed above the ends of the substrate 4 with a coupling gap so that the probing pins 31 and 33 are above the superconducting groundplanes 6 and the probing pins 32 are above the superconducting center lines 5 as shown in FIG. 2.

By this, the superconducting device 1 is coupled with the room temperature circuitry by capacitive coupling in vacuum of a pressure lower than $10^{-5}$ Torr without mechanical contact which can thermally isolate the superconducting device 1.

In this embodiment, the substrate 4 is a $LaAlO_3$ substrate having a dimension of 15×15×0.5 mm, the superconducting center lines 5 have a thickness of 300 nanometers and a width of 0.07 mm, and the superconducting groundplanes 6 have a thickness of 300 nanometers and dimension of 0.5×0.6 mm. The gaps between the superconducting center lines 5 and the superconducting groundplanes 6 are 0.18 mm.

In addition, the probing pins 31, 32 and 33 of the probe-heads 21 and 22 are disposed with clearance of 0.25 mm and the coupling gap, between the probe-heads 21 and 22 and the superconducting center lines 5 is 0.02 mm.

For the above joint device, a coupling characteristics of the transmission power was measured by use of a network analyzer.

By locating the joint device in accordance with the present invention in a cryostat, the quality factor and resonant frequency of the series LC resonator was measured at 20K in the under coupled regime. By applying dc electric field across the capacitor, the resonant frequency was varied through the changes in the capacitance.

The use of room temperature microwave probe heads 21 and 22 did not lead to any appreciable heating in the device. Quality factor measurement as a function of temperature lead to the conclusion that the heating due to close proximity of the microwave probe heads on the superconducting device is less than 5K.

It will be noted that precise measurement of resonant frequency and quality factor can be obtained by using the joint device in accordance with the present invention and no significant temperature change could be observed.

As mentioned above, the joint device in accordance with the present invention is so constructed that the superconducting microwave devices can be characterized without heat generation.

Accordingly, the joint device in accordance with the present invention can be effectively used in hybrid microwave communication instruments, and the like, where room temperature and low temperature circuitry are coupled together.

The invention has thus been shown and described with reference to the specific embodiments. However, it should be noted that the present invention is in no way limited to the details of the illustrated structures but changes and modifications may be made within the scope of the appended claims.

We claim:

1. A joint device structure for capacitive microwave coupling of a superconducting device arranged on a substrate with room temperature circuitry, comprising:

a superconducting wave guide comprised of a respective oxide superconductor arranged on said substrate at one side of the superconducting device, the superconducting wave guide being used for launching a microwave into the superconducting device;

a pair of superconducting groundplanes comprised of a respective oxide superconductor arranged on said substrate at mutually opposite sides of an end of the superconducting wave guide with a respective spacing between the pair of superconducting groundplanes and the end of the superconducting wave guide; and a microwave probe-head, connected to the room temperature circuitry, arranged a distance above the superconducting wave guide corresponding to a coupling gap, said microwave probe-head including probing pins corresponding to the superconducting wave guide and the pair of superconducting groundplanes.

2. A joint device structure claimed in claim 1, wherein the probing pins include three probe pins respectively arranged above one of the superconducting wave guide and the pair of superconducting groundplanes.

3. A joint device structure claimed in claim 1, wherein the oxide superconductor of the superconducting wave guide is a high critical temperature copper-oxide type oxide superconductor material.

4. A joint device structure claimed in claim 3, wherein the oxide superconductor of the superconducting wave guide is a material selected from the group consisting of a Y—Ba—Cu—O type compound oxide superconductor material, a Bi—Sr—Ca—Cu—O type compound oxide superconductor material, Tl—Ba—Ca—Cu—O type compound oxide superconductor material, a Hg—Ba—Sr—Ca—Cu—O type compound oxide superconductor material and a Nd—Ce—Cu—O type compound oxide superconductor material.

5. A joint device structure claimed in claim 1, wherein the oxide superconductor of the superconducting groundplanes is a high critical temperature copper-oxide type oxide superconductor material.

6. A joint device structure claimed in claim 5, wherein the oxide superconductor of the superconducting groundplanes is a material selected from the group consisting of a Y—Ba—Cu—O type compound oxide superconductor material, a Bi—Sr—Ca—Cu—O type compound oxide superconductor material, Tl—Ba—Ca—Cu—O type compound oxide superconductor material, a Hg—Ba—Sr—Ca—Cu—O type compound oxide superconductor material and a Nd—Ce—Cu—O type compound oxide superconductor material.

7. A microwave device including a superconducting device arranged on a surface of a substrate and room-temperature circuitry, comprising:

a superconducting guiding structure comprised of an oxide superconductor arranged on the surface of the substrate and being connected to the superconducting device; and a microwave probe-head connected to the room-temperature circuitry and capacitively coupled to the superconducting guiding structure, wherein the superconducting device is coupled to the room-temperature circuitry via the capacitive coupling of the superconducting guiding structure to the microwave probe-head.

8. A device as recited in claim 7, further comprising a groundplane acting as a groundplane for the superconducting guiding structure.

9. A device as recited in claim 8, wherein the groundplane is formed on the surface of the substrate.

10. A device as recited in claim 8, where in the groundplane is comprised of an oxide superconductor.

11. A device as recited in claim 10, wherein said microwave probe head further comprises a plurality of probe pins, at least one of the probe pins being arranged a predetermined distance from the superconducting guiding structure and at least another one of the probe pins is arranged a predetermined distance from the groundplane.

12. A device as recited in claim 11, wherein the plurality of probe pins are arranged in a position above the superconducting guiding structure and the groundplane, respectively.

13. A device as recited in claim 7, wherein the superconducting device has a plurality of sides and the superconducting guiding structure is connected to the superconducting device on a first side of the superconducting device, and further comprising:

an additional superconducting guiding structure comprised of an oxide superconductor arranged on the surface of said substrate and being connected to the superconducting device on a second side of the superconducting device; and an additional microwave probe-head connected to additional room-temperature circuitry and capacitively coupled to the additional superconducting guiding structure, wherein the superconducting device is coupled to the additional room temperature circuitry via the capacitive coupling of the additional superconducting guiding structure to the additional microwave probe-head.

14. A device as recited in claim 13, wherein microwaves are transferred from the room-temperature circuitry to the superconducting guiding structure via the capacitive coupling, launched into the superconducting device from the superconducting guiding structure, and transferred to the additional room-temperature circuitry via the additional superconducting guiding structure.

\* \* \* \* \*